(12) United States Patent
Pontis et al.

(10) Patent No.: US 6,829,259 B2
(45) Date of Patent: Dec. 7, 2004

(54) TUNABLE LASER CONTROL SYSTEM WITH OPTICAL PATH LENGTH MODULATION

(75) Inventors: George D. Pontis, Redwood City, CA (US); Douglas A. Sprock, San Jose, CA (US); Robert Carney, Belmont, CA (US)

(73) Assignee: Intel Corporation, Santa Clara, CA (US)

( * ) Notice: Subject to any disclaimer, the term of this patent is extended or adjusted under 35 U.S.C. 154(b) by 39 days.

(21) Appl. No.: 10/355,731

(22) Filed: Jan. 30, 2003

(65) Prior Publication Data

US 2003/0142700 A1 Jul. 31, 2003

Related U.S. Application Data

(62) Division of application No. 09/900,108, filed on Jul. 6, 2001, now Pat. No. 6,631,146.

(51) Int. Cl.[7] .............................. H01S 3/10; H01S 3/00
(52) U.S. Cl. ...................................... 372/20; 372/38.1
(58) Field of Search ....................... 372/20, 38.1–38.09

(56) References Cited

U.S. PATENT DOCUMENTS

| | | | |
|---|---|---|---|
| 3,582,819 A | * | 6/1971 | Muller et al. ................. 372/26 |
| 3,783,406 A | * | 1/1974 | Hook et al. ................... 372/12 |
| 4,097,818 A | * | 6/1978 | Manoukian et al. .......... 372/19 |
| 4,314,210 A | * | 2/1982 | Everett ......................... 372/18 |
| 4,314,211 A | | 2/1982 | Mollenauer .................. 372/32 |
| 4,485,474 A | * | 11/1984 | Osterwalder ................. 372/28 |
| 4,498,179 A | | 2/1985 | Wayne et al. ................. 312/27 |
| 4,672,618 A | | 6/1987 | Wijntjes et al. ............... 372/32 |
| 4,779,279 A | | 10/1988 | Brown ......................... 372/37 |
| 5,153,771 A | * | 10/1992 | Link et al. ................... 359/286 |
| 6,108,355 A | | 8/2000 | Zorabedian ................... 372/20 |
| 6,282,215 B1 | | 8/2001 | Zorabedian et al. .......... 372/20 |

FOREIGN PATENT DOCUMENTS

| | | |
|---|---|---|
| WO | WO 98/05105 A1 | 2/1998 |
| WO | WO 01/04999 A1 | 1/2001 |

OTHER PUBLICATIONS

PCT Search Report, Oct. 16, 2002.

* cited by examiner

*Primary Examiner*—Quyen Leung
(74) *Attorney, Agent, or Firm*—Blakely, Sokoloff, Taylor & Zafman LLP

(57) ABSTRACT

A laser system including a controller for monitoring and controlling various functions of a laser assembly. The laser controller may include a wavelength tuning circuit for adjusting and locking the wavelength of the external cavity. To perform various monitoring and control functions, the controller may include circuitry for monitoring various parameters associated with operation of the laser, such as temperature indicating signals and/or signals from light detectors such as photodiodes.

17 Claims, 11 Drawing Sheets

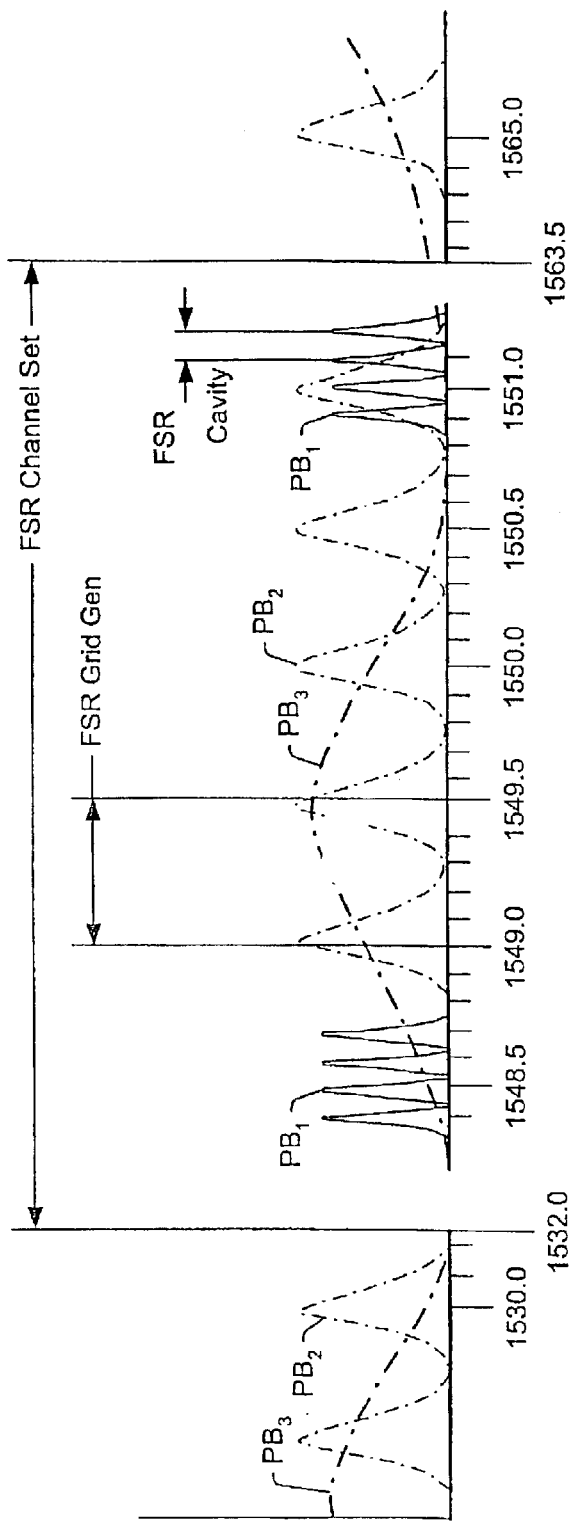
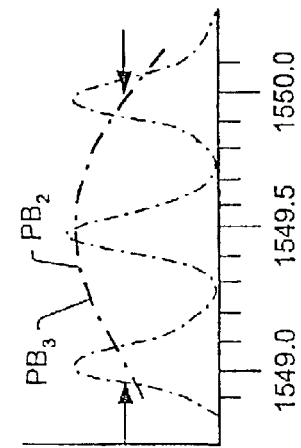

TUNABLE LASER CONTROL SYSTEM WITH OPTICAL PATH LENGTH MODULATION

This is a Divisional of U.S. application Ser. No. 09/900,108, filed Jul. 6, 2001, now U.S. Pat. No. 6,631,146.

BACKGROUND OF THE INVENTION

1. Field of the Invention

This invention relates to laser systems and, more particularly, to electronic controllers for controlling and monitoring operations of a tunable laser, such as an external cavity diode laser.

2. Description of the Related Art

Tunable external cavity diode lasers (ECDLs) are widely used in lightwave test-and-measurement equipment and are becoming recognized as essential components for the rapidly expanding fields of wavelength division multiplexed (WDM) optical voice and data communications. The many applications within these fields represent many different sets of performance specifications. However, the following requirements are typical: small size of the optomechanical assembly and control system; servo control of the wavelength; and controllable frequency modulation (FM) at audio rates (e.g., 100 Hz to 30 kHz) in order to broaden the linewidth.

To achieve desired control over the operation of external cavity diode lasers, electronic controllers are typically provided that implement various functionality. This functionality may include a current source for providing current to the laser, locked wavelength tuning functionality, a modulation source, and various other functionality to precisely control and monitor operation of the tunable laser. It is typically desirable that the electronic controller allow for versatile control of the tunable laser with reasonable efficiency and a relatively small form factor. It is also typically desirable that electrical noise within the system and its impact upon various measurement functions be minimized.

SUMMARY OF THE INVENTION

A laser control system for monitoring and controlling various functions of a laser assembly is provided. In one embodiment, the laser assembly comprises a tunable external cavity laser. The laser controller may include a wavelength tuning circuit for adjusting and locking the wavelength of the external cavity. The tuning circuit may include a modulation signal generator for providing a modulation signal to a selected transmission element that causes a corresponding modulation of the optical path of the laser external cavity. Wavelength locking may be achieved by monitoring transmission characteristics that vary due to the slight modulation of the optical path. Such transmission characteristics may be monitored, for example, by detecting variations in the voltage across a gain medium or variations in the intensity of light associated with the laser external cavity. The tuning circuit may include a signal processor such as a microprocessor that performs a Fourier Transform, such as a Fast Fourier Transform, upon data indicative of the transmission characteristics to thereby generate an error signal for adjusting the length of the optical path of the external cavity.

To perform various monitoring and control functions, the controller may include circuitry for monitoring various parameters associated with operation of the laser, such as temperature indicating signals and/or signals from light detectors such as photodiodes. The controller may additionally detect other parameters, such as a voltage across a gain medium. In one embodiment, the sensing of such parameters is performed synchronously with the generation of various control signals for controlling operation of the external cavity laser. The control signals may include signals for adjusting the external cavity pathlength and for generating a modulation signal. The control signals may be in the form of pulse-width modulated signals, which may be generated by a programmable logic device. In one embodiment, temperature-dependent resistive elements such as thermistors may be used to provide signals indicative of the temperature of various components of the laser assembly. A switching circuit may be employed to couple a selected temperature-dependent resistive element to a common measurement path for detecting a temperature associated with the selected temperature-dependent resistive element. In yet a further embodiment, a control circuit for generating a modulating output signal may include a transformer including a primary coil coupled to an amplifier circuit in a push-pull configuration. A laser current source may be provided that includes a control circuit for controlling a level of current supplied to a laser device through a drive transistor, and a common gate or common base configured transistor coupled between the control circuit and a control terminal of the drive transistor. The laser controller may include a network interface to allow remote control of the laser.

BRIEF DESCRIPTION OF THE DRAWINGS

FIGS. 2A–2C and FIGS. 3A–3C are diagrams illustrating pass band relationships associated with an external cavity laser.

Figure 1:
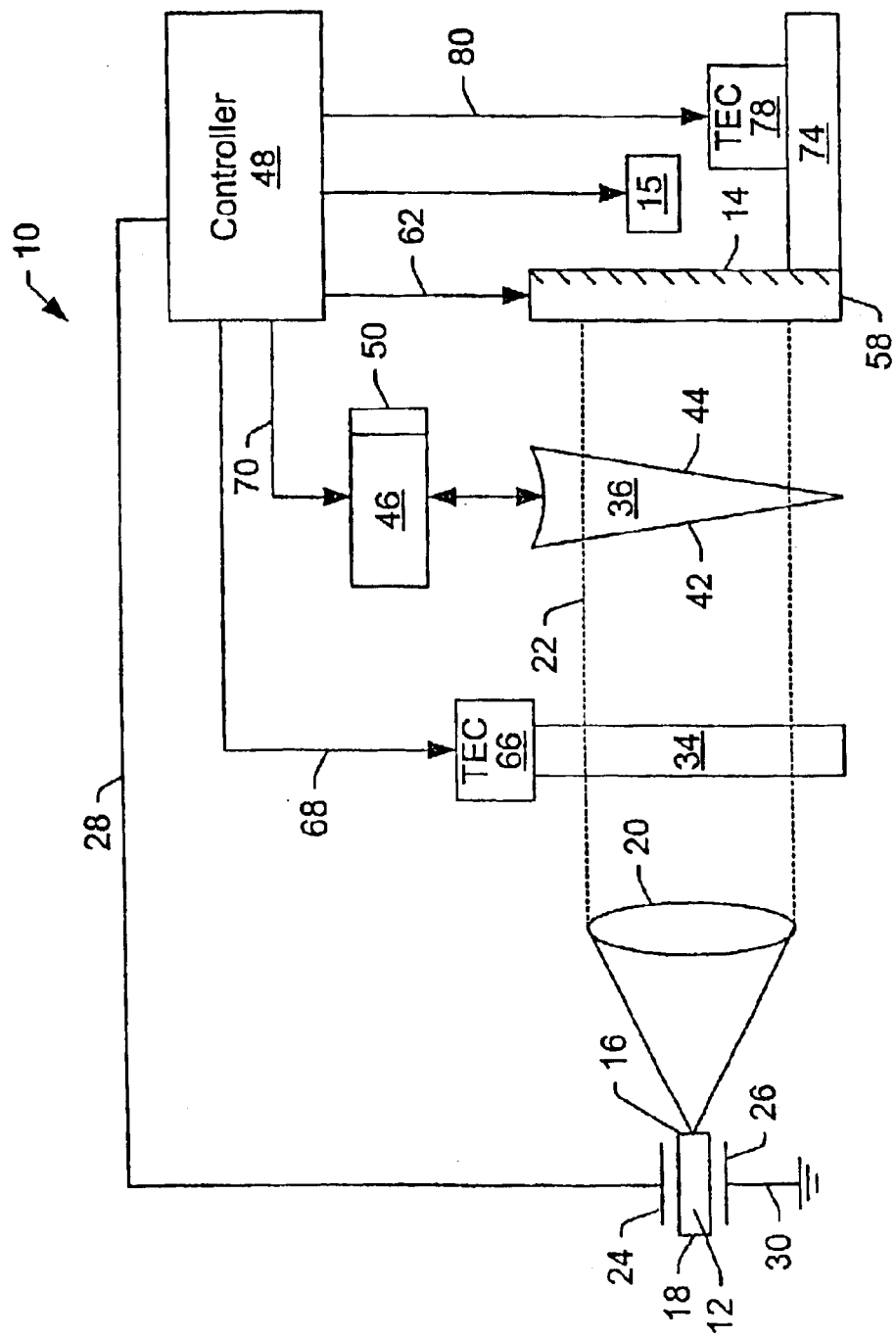
FIG. 1 is a block diagram illustrating various aspects of a tunable external cavity laser.

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the spirit and scope of the present invention as defined by the appended claims.

DETAILED DESCRIPTION

The term "external cavity laser" as used herein is meant to encompass any laser device wherein at least one external reflective element is used to introduce optical feedback into again medium. "External reflective element" means a reflective element that is not actually a part of, or integral to, the gain medium itself.

FIG. 1 illustrates various aspects of one embodiment of a tunable external cavity laser apparatus 10. The apparatus 10 includes a gain medium 12 and an end or external reflective element 14. Gain medium 12 may comprise a conventional Fabry-Perot diode emitter chip having an anti-reflection (AR) coated rear facet 16 and a partially reflective front facet 18. Front facet 18 and end mirror 14 define an external cavity for the apparatus 10. Gain medium 12 emits a coherent beam from rear facet 16 that is collimated by lens 20 to define an optical path 22 which is co-linear with the optical axis of the external cavity. Rear and front facets 16, 18 of gain medium 12 are aligned with the optical axis of the external cavity as well. Light reflected from end mirror 14 is fed back along optical path 22 into gain medium 12. Conventional output coupler optics (not shown) may be associated with front facet 18 for coupling the output of external cavity laser 10 into an optical fiber (also not shown).

Transmission characteristics of the external cavity can be probed or evaluated by monitoring the voltage across gain medium 12. In this regard, first and second electrodes 24, 26 may be positioned adjacent to and operatively coupled to gain medium 12. First electrode 24 is operatively coupled to a controller 48 via a conductor 28, where the voltage across gain medium 12 may be detected. A second electrode 26 is grounded via conductor 30. It is noted that in various other embodiments, transmission characteristics of the external cavity may be alternatively evaluated by monitoring the output of one or more photodiodes 15 (or any other type of light detector) that may be positioned to receive portions of light associated with the external cavity laser. For example, in one embodiment, a photodiode may be positioned to detect light propagating through the partially reflective end, mirror 14. In another embodiment, a photodiode may be positioned to detect light propagating through front facet 18 of gain medium 12. Photodiodes may be positioned to detect light associated with the external cavity laser at other particular locations, as desired.

Error signals may be derived from the voltage measured across gain medium 12 to correct or otherwise adjust the transmission characteristics associated with the external cavity. Details regarding specific implementations of this functionality are provided further below.

Other transmission elements associated with the external cavity may include a grid generator element and a channel selector element, which are respectively shown in FIG. 1 as a grid etalon 34 and a wedge etalon 36 positioned in optical path 22 between gain medium 12 and end mirror 14. Grid etalon 34 typically is positioned in optical path 22 before wedge etalon 26. Grid etalon 34 operates as an interference filter, and the refractive index and optical thickness of grid etalon 34 give rise to a multiplicity of minima within the communication band at wavelengths which coincide with the center wavelengths of a selected wavelength grid which may comprise, for example, the ITU (International Telecommunications Union) grid. Other wavelength grids may alternatively be selected. Grid etalon 34 thus has a free spectral range (FSR) which corresponds to the spacing between the grid lines of the ITU grid or other selected grid, and the grid etalon 34 thus operates to provide a plurality of pass bands centered on each of the gridlines of the wavelength grid. Grid etalon 34 has a finesse (free spectral range divided by full width half maximum or FWHM) which suppresses neighboring modes of the external cavity laser between each channel of the wavelength grid.

Grid etalon 34 may be a parallel plate solid, liquid or gas spaced etalon, and may be tuned by precise dimensioning of the optical thickness between its faces by thermal expansion and contraction via temperature control. The grid etalon 34 may alternatively be tuned by tilting to vary the optical thickness between faces 38, 40, or by application of an electric field to an electro-optic etalon material. Various other grid generating elements are known to those skilled in the art and may be used place of grid etalon 34. Grid etalon 34 may be thermally controlled using a temperature controller (TEC) 66 to prevent variation in the selected grid which may arise due to thermal fluctuation during operation of external cavity laser 10. Grid etalon 34 alternatively may be actively tuned during laser operation.

Wedge etalon 36, like grid etalon 34, acts as an interference filter, but with non-parallel reflective faces 42, 44 providing a tapered shape. When etalon 36 may comprise a tapered transparent substrate, a tapered air gap between the reflective surfaces of adjacent transparent substrates, or a thin film wedge interference filter as described further below.

The relative size, shape and distances between the various optical components of external cavity laser 10 are in some instances exaggerated for clarity and are not necessarily shown to scale. External cavity laser 10 may include additional transmission elements (not shown), such as focusing and collimating components, and polarizing optics configured to remove spurious feedback associated with the various components of external cavity laser 10. The location of grid generator 34 and channel selector 36 may vary from that shown in FIG. 1.

Wedge etalon 36 defines a plurality of pass bands which are substantially broader than the pass bands of the grid etalon 34, with the broader pass bands of the wedge etalon 36 having a periodicity substantially corresponding to the separation between the shortest and longest wavelength channels defined by the grid etalon 34. In other words, the free spectral range of the wedge etalon 36 corresponds to the full wavelength range of the wavelength grid defined by grid etalon 34. The wedge etalon 36 has a finesse which suppresses channels adjacent to a particular selected channel.

The wedge etalon 36 may be used to select between multiple communication channels by changing the optical thickness between faces 42, 44 of wedge etalon 36. This is achieved by translating or driving wedge etalon 36 in a direction parallel to the taper of wedge etalon 36 and perpendicular to optical path 22 and the optical axis of external cavity laser 10. Each of the pass bands defined by the wedge etalon 36 supports a selectable channel, and as the wedge is advanced or translated into optical path 22, the beam traveling along optical path 22 passes through increasingly thicker portions of wedge etalon 36 which support constructive interference between opposing faces 42, 44 at longer wavelength channels. As wedge etalon 36 is withdrawn from optical path 22, the beam will experience increasingly thinner portions of wedge etalon 36 and expose pass bands to the optical path 22 which support correspondingly shorter wavelength channels. The free spectral range of wedge etalon 36 corresponds to the complete wavelength range of grid etalon 34 as noted above, so that a single loss minimum within the communications band can be tuned across the wavelength grid. The combined feedback to gain medium 12 from the grid etalon 34 and wedge etalon 36 support lasing at the center wavelength of a selected channel. Across the tuning range, the free spectral range of the wedge etalon 36 is broader than that of grid etalon 34.

Wedge etalon 36 is positionally tuned via a tuning assembly which comprises a drive element 46 structured and configured to adjustably position wedge etalon 36 according to selected channels. Drive element 46 may comprise, for example, a stepper motor together with suitable hardware for precision translation of wedge etalon 36. Drive element 46 may alternatively comprise various types of actuators, including, but not limited to, DC servomotors, solenoids, voice coil actuators, piezoelectric actuators, ultrasonic drivers, shape memory devices, and like linear actuators.

Drive element 46 is operatively coupled to controller 48 which provides signals to control the positioning of wedge etalon 36 by way of drive element 46. Controller 48 may include a data processor and memory (not shown in FIG. 1) having lookup tables of positional information for wedge etalon 36 which correspond to selectable channel wavelengths.

When external cavity laser 10 is tuned to change from one communication channel to another, controller 48 may convey signals to drive element 46 according to positional data in a lookup table, and drive element 46 translates or drives wedge etalon 36 to a position wherein the optical thickness of the portion of the wedge etalon 36 positioned in optical path 22 provides constructive interference which supports the selected channel. A position detector 50 such as a linear encoder may be used in association with wedge etalon 36 and drive element 46 to ensure correct positioning of wedge etalon 36 by driver 46. Alternatively, a single point position electro-optic detector may be provided to locate a "home" position associated with wedge etalon 36 during initialization of the system.

An electro-optically activated modulation element 58 is also shown positioned in optical path 22 before end mirror 14. In the embodiment of FIG. 1, end mirror 14 is formed as a reflective coating directly on the electro-optic material of modulation element 58. Thus, the end mirror 14 and modulation element, 58 are combined into a single component. In other embodiments, end mirror 14 may be formed on a element that is separate from modulation element 58. Details regarding the function of modulation element 58 will be provided further below.

The pass band relationship of the grid etalon 34, wedge etalon 36 and the external cavity defined by front facet 18 and end mirror 14 are illustrated graphically in FIG. 2A through FIG. 2C, which show external cavity pass bands PB1, grid etalon pass bands PB2, and wedge etalon pass bands PB3. Relative gain is shown on the vertical axis and wavelength on the horizontal axis. As can be seen, free spectral range of the wedge etalon 36 ($FSR_{Channel\ Sel}$) is greater than the free spectral range of the grid etalon 34 ($FSR_{Grid\ Gen}$), which in turn is greater than the free spectral range of the external cavity ($FSR_{Cavity}$). The band pass peaks PB1 of the external cavity periodically align with the center wavelengths of pass bands PB2 defined by the wavelength grid of grid etalon 34. There is one pass band peak PB3 from the wedge etalon 36 which extends over all of the pass bands PB2 of the wavelength grid. In the specific example shown in FIGS. 2A–2C, the wavelength grid extends over sixty four channels spaced apart by one half nanometer (nm) or 62 GHz, with the shortest wavelength channel at 1532 nm, and the longest wavelength channel at 1563.5 nm.

The finesse of grid etalon 34 and wedge etalon 36 determine the attenuation of neighboring modes or channels. As noted above, finesse is equal to the free spectral range over the full width half maximum, or finesse=FSR/FWHM. The width for a grid etalon pass band PB2 at half maximum is shown in FIG. 2B, and the width for a wedge etalon pass band PB3 at half maximum is shown in FIG. 2C. The positioning of grid etalon 34 and wedge etalon 36 within the external cavity improves side mode suppression.

Figure 3A:
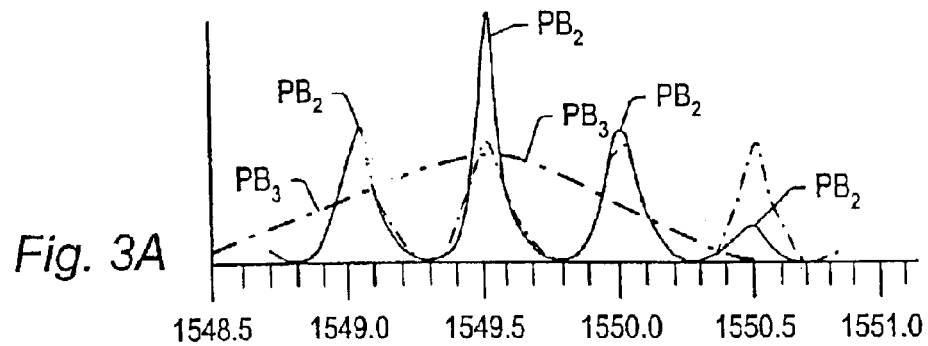
Figure 3B:
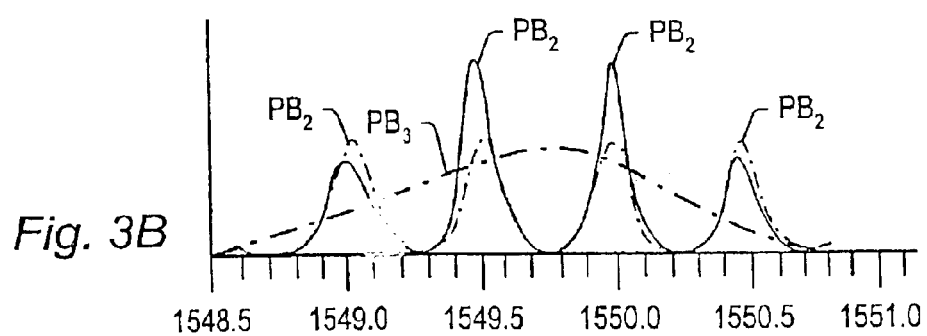
Figure 3C:
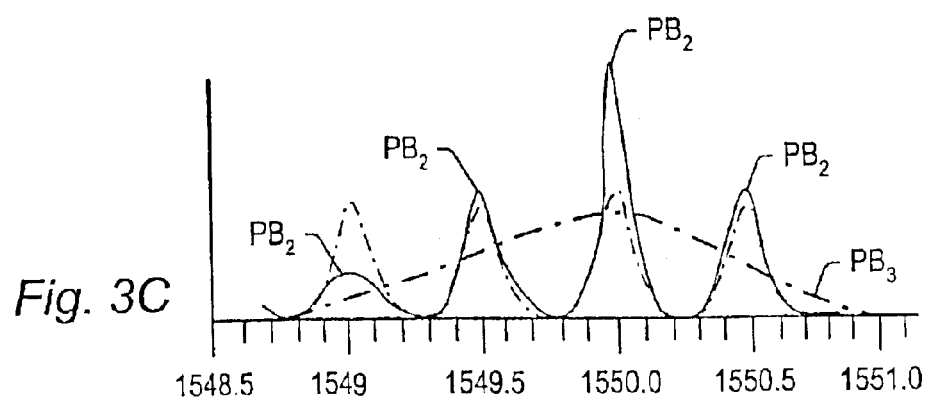

The tuning of the band pass PB3 of wedge etaloh 36, between a channel centered at 1549.5 nm and an adjacent channel at 1550 nm is illustrated graphically in FIGS. 3A–3C, wherein the selection of a channel generated by grid etalon 24 and the attenuation of adjacent channels or modes is shown. The external cavity pass bands PB1 shown in FIGS. 2A–2C are omitted from FIGS. 3A–3C for clarity. The grid etalon 34 selects periodic longitudinal modes of the external cavity corresponding to the grid channel spacing while rejecting neighboring modes. The wedge etalon 36 selects a particular channel in the wavelength grid and rejects all other channels. The selected channel or lasing mode is stationary at one particular channel for filter offsets in the range of approximately plus or minus one half channel spacing. For larger channel offsets the lasing mode jumps to the next adjacent channel.

In FIG. 3A, the wedge etalon pass band PB3 is centered with respect to the grid channel at 1549.5 nm. The relative gain associated with pass band PB2 at 1549.5 nm is high, while the relative gain levels associated with adjacent pass bands PB2 at 1549.0 nm and 1550.0 nm are suppressed relative to the selected 1549.5 nm channel. The gain associated with pass bands PB2 at 1550.5 nm and 1548.5 nm is further suppressed. The dashed line indicates the relative gain for pass bands PB2 without suppression by wedge etalon 36.

FIG. 3B shows the wedge etalon pass band PB at a position in between the channels at 1549.5 nm and 1550.0 nm, as occurs during channel switching. The relative gain associated with pass bands PB2 at 1549.5 nm and 1550.0 nm are both high, with neither channel suppressed. The relative gain levels associated with pass bands PB2 at 1549.0 nm and 1550.5 nm are suppressed relative to the 1549.5 nm and 1550.0 nm channels. The dashed line indicates the relative gain for pass bands PB2 without suppression by wedge etalon 36.

FIG. 3C shows the wedge etalon pass band PB3 centered with respect to the grid channel at 1550.0 nm, with the relative gain associated with the pass band PB2 at 1550.0 nm being high, while the relative gain levels associated with adjacent pass bands PB2 at 1549.5 nm and 1550.5 nm are suppressed relative to the selected 1550.0 nm channel, and the gain associated with pass bands PB2 at 1551.0 nm and 1549.0 nm is further suppressed. Again, the dashed line indicates the relative gain for pass bands PB2 without suppression by wedge etalon 36.

As can be seen from FIG. 2 and FIG. 3, non-optimal positioning or tuning of channel selector 36, end mirror 14 and/or grid generator 34 will result in mis-alignment of pass bands PB1, PB2 and PB3 and give rise to attenuation in optical output power. from the external cavity laser 10. Monitoring of voltage across gain medium 12 via voltage sensor 32 allows such external cavity transmission characteristics to be probed or evaluated during laser operation. Error signals derived from the monitored voltage can then be used to adjust or servo the transmission profile of the external cavity during operation such that pass bands PB1, PB2 and PB3 are optimally aligned with respect to each other by suitable repositioning or adjusting of end mirror 14, wedge etalon 36 and/or grid etalon 34, thus providing accurate wavelength tuning and stability. As stated previously, in various other embodiments, such error signals may be alternatively derived using one or more photodiodes 15.

The electro-optic modulation element 58 as shown in FIG. 1 provides a signal modulation in the form of a frequency dither, which may be introduced into the optical path length of the external cavity laser 56 by the presence of element 58 in optical path 22. Modulation element 58 may comprise an etalon of electro-optic material such as lithium niobate, and has a voltage-adjustable refractive index. The signal modulation may comprise, for example, a frequency modulation of about 20 KHz. Adjustment of voltage across the electro-optic material of tuning element changes the effective optical thickness of modulation element 58, and hence the overall optical path length l across the external cavity (between diode facet 18 and end mirror 14) of external cavity laser 56. Thus, electro-optic modulation element 58 may provide both (i) a frequency modulation signal or dither to the external cavity, and (ii) a mechanism to tune or adjust the external cavity optical path length by voltage applied across modulation element 58. Electro-optic modulation element 58 may alternatively comprise an acousto-optic device, mechanical device, or other device capable of introducing a detectable frequency dither or modulation signal into the output of the external cavity.

Modulation of the optical path length l via frequency dither introduced by element 58 produces intensity variations in the output, power of external cavity laser 56 which are detectable in the monitored voltage across gain medium 12, due to optical feedback thereinto from the external cavity. These intensity variations will decrease in magnitude and phase error as a laser cavity mode is aligned with the center wavelength of the pass bands defined by grid generator 34 and channel selector 36. In other words, the intensity variations and phase error in the modulation signal are minimal or nominally zero when pass bands PB1, PB2 and PB3 are optimally aligned as shown in FIGS. 2A–2C. The use of intensity variation and phase error in the modulated signal with respect to error signal determination is described further below with reference to FIG. 5.

A tuning arm 74 may further be employed to positionally adjust end mirror according to input from controller 48. Tuning arm 74 may be made from a material having a high coefficient of thermal expansion, such as aluminum or other metal or metal alloy. Controller 48 is operatively coupled to a thermoelectric controller 78 via line 80. Thermoelectric controller 78 is coupled to tuning arm and is configured to adjust the temperature of arm 74. Thermal control (heating or cooling) of tuning arm 74, according to signals from controller 76, may be used in this embodiment to control the position of end mirror 14 and the length of optical path l of the external cavity defined by end mirror and front facet 18 of gain medium 12 in an optimal position.

The frequency modulation introduced by modulation element 58 is detectable by controller 48 by monitoring the voltage across the gain medium 12 or a signal from one or more photodiodes 15, and the frequency modulation includes variations in magnitude and phase error indicative of laser cavity mode alignment with the center wavelength of the pass bands defined by grid generator 34 and, channel selector 36, as noted above. Controller 48 may be configured to derive an error signal from the modulation introduced by the frequency dither, and to communicate a compensation signal to thermoelectric controller 78 which accordingly heats or cools tuning arm 74 to position end mirror 14 and adjust the optical path length l of external cavity laser to null out the error signal.

Figure 4:
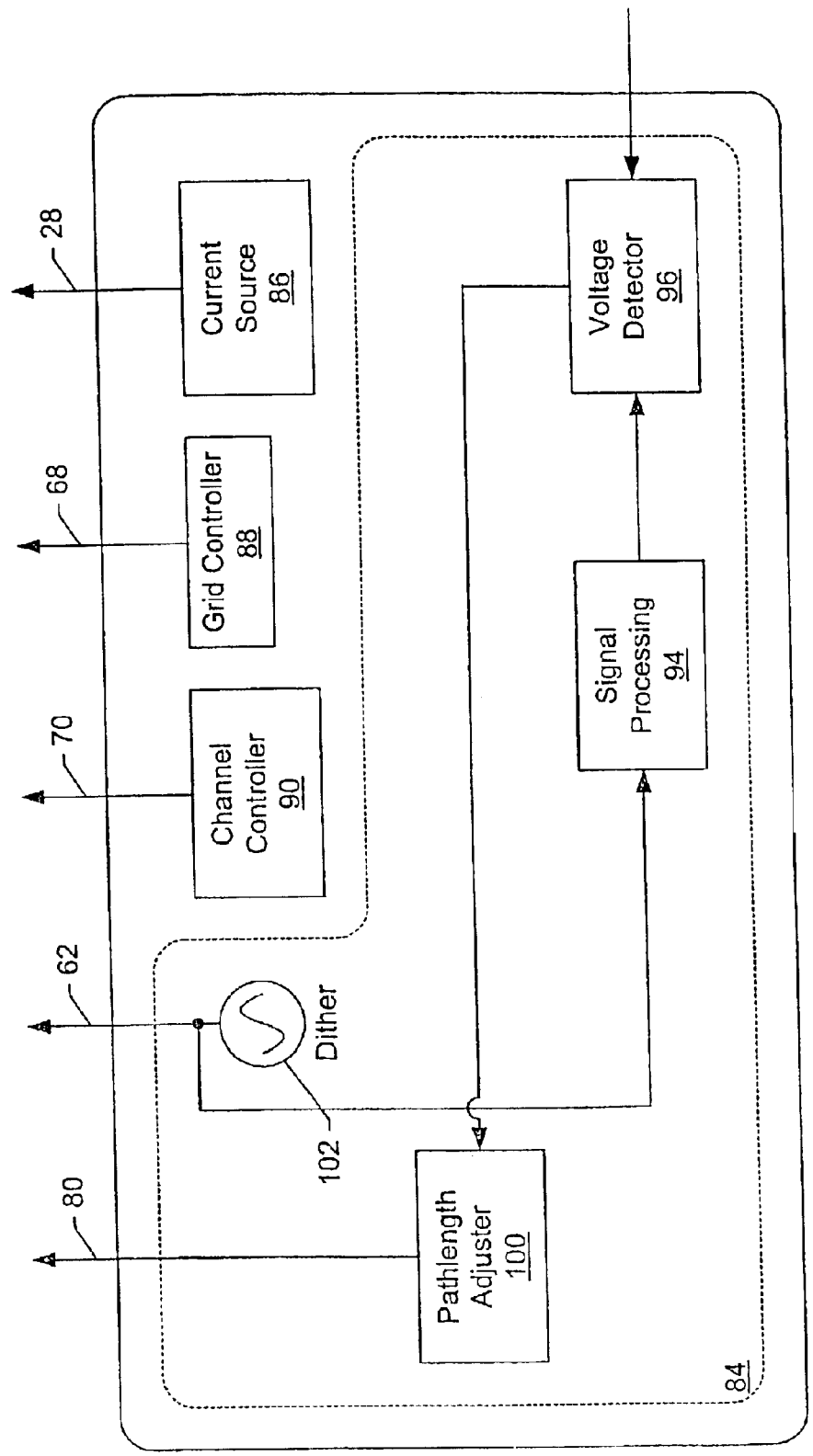
FIG. 4 is a functional block diagram illustrating aspects of one embodiment of a laser controller.

FIG. 4 is a functional block diagram illustrating aspects of one embodiment of controller 48. The controller of FIG. 4 includes a tuning circuit 84, a current source 86 operatively coupled to gain medium 12 via line 28, a grid controller 88 operatively coupled to thermoelectric controller 66 via line 68, and a channel controller 90 operatively coupled to drive element 46 via line 70. The current source 86 controls the power delivered to gain medium 12. The grid controller 88 maintains the referential integrity of grid etalon 34 by thermal control thereof using thermoelectric controller 66 to heat or cool grid etalon 34 as required. Channel controller 90 directs drive element 46 to position or otherwise adjust channel selector 36 for selection of desired transmission bands in the grid defined by grid etalon 34.

Tuning circuit 84 comprises a signal processor 94, a voltage detector 96, a path length adjuster 100, and a modulation signal generator 102. Modulation signal generator 102 provides a frequency dither or modulation signal to a selected loss element (e.g., modulation element 58) that causes a corresponding modulation of the optical path l of the laser external cavity. The modulation frequency and amplitude may be selected, for example, to increase effective coupling efficiency. The voltage across gain medium 12 (or a signal derived from a photodiode 15, as discussed previously) may be detected by voltage detector 96 and communicated to signal processing circuit 94. The signal processing circuit 94 may be configured to determine the alignment of passbands PB1 (FIG. 2 and FIG. 3) of the external cavity with passbands PB2 of grid etalon 34 and passbands PB3 of channel selector 36, and to generate corresponding error information.

Pathlength adjuster 100 generates an error correction or compensation signal, from the error information provided by signal processing 94, that is used to adjust the optical path length l of the external cavity in order to optimize the relationship between the modulation signal and the intensity signal. When an external cavity mode or pass band PB1 is aligned with bands PB2 and PB3 generated by grid generator 34 and channel selector 36, intensity variations at the modulation frequency (and odd multiples thereof) in thee coherent beam traveling optical path 22 are substantially minimized, as discussed further below with reference to FIG. 5. Concurrently, the voltage signal intensity will vary at twice the modulation frequency. Either or both of these detectable effects are usable to evaluate external cavity loss associated with loss characteristics associated with the positioning or inter-relationship of end mirror 14, grid generator 34 and channel selector 36, and to generate error signals usable for adjustment of cavity loss characteristics such that the modulation signal and intensity signal are optimized. As discussed previously, in one embodiment, adjustment of the optical path length l may be carried out via thermal positioning of end mirror 14 in conjunction with tuning arm 74 and temperature controller 78. In other embodiments, pathlength adjuster 100 may control other elements that adjust the optical pathlength l of the external cavity laser.

Figure 5:
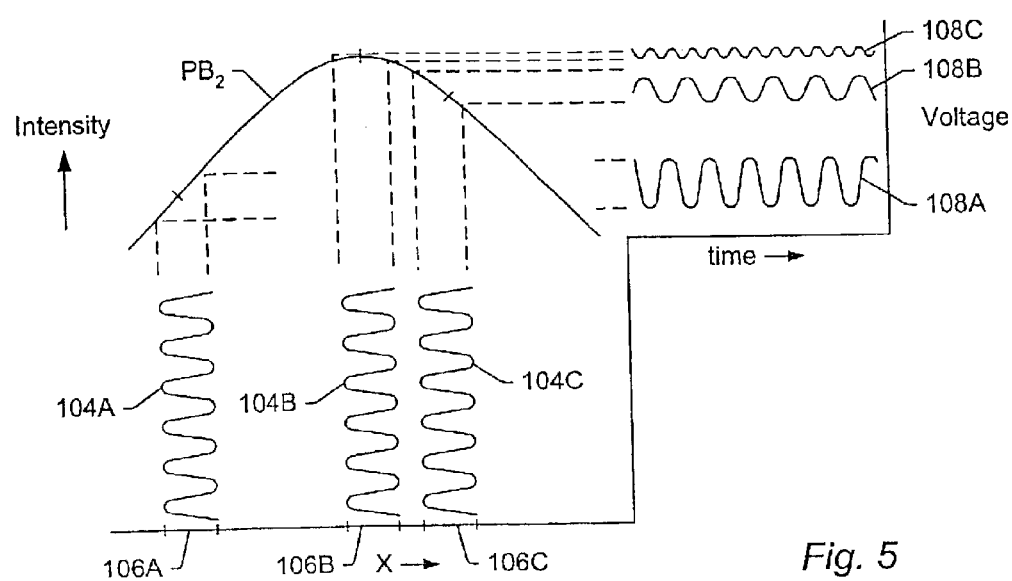
FIG. 5 is a diagram illustrating a relationship of a modulation signal with respect to detected voltage modulation across a gain medium.
Figure 6:
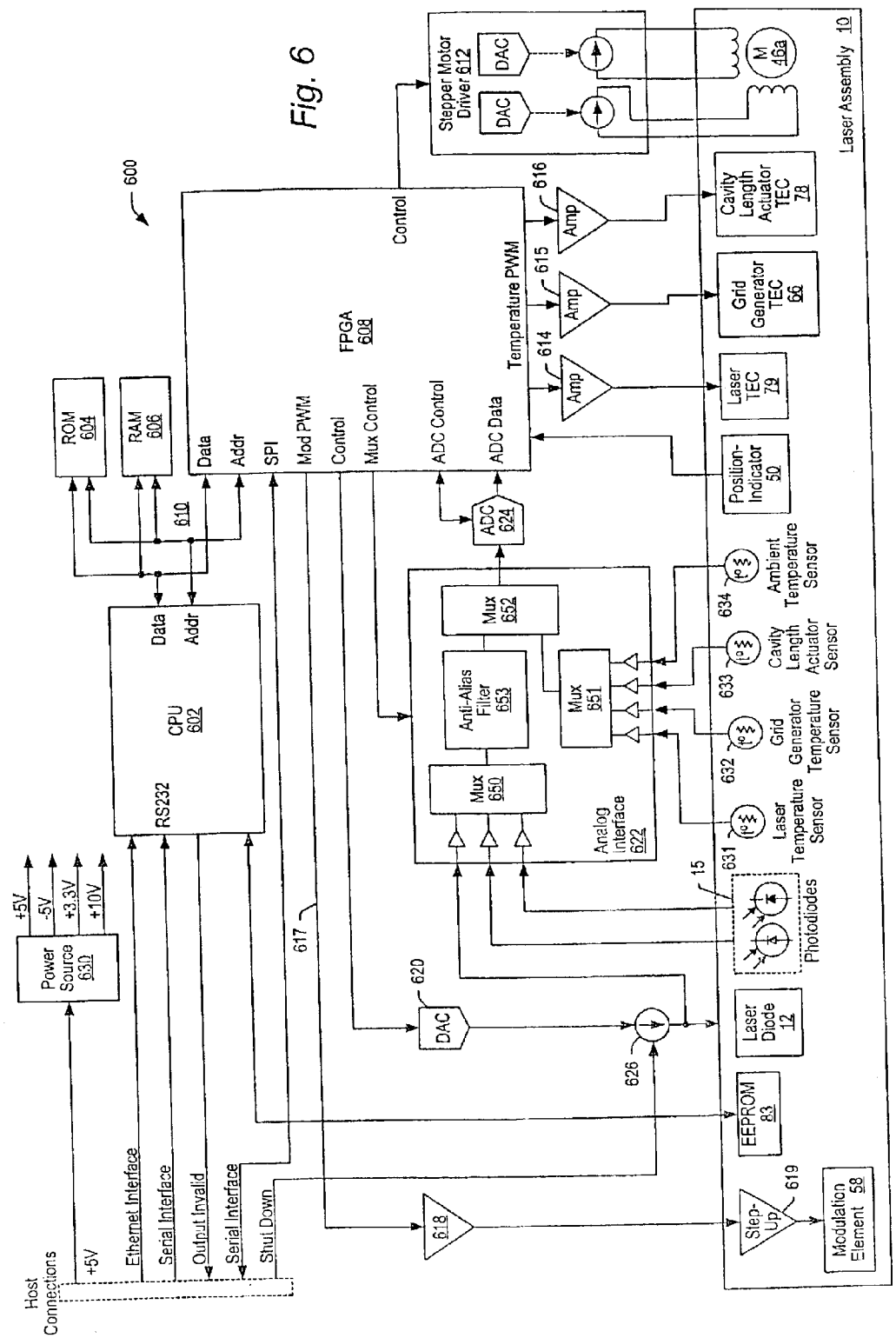
FIG. 6 is a hardware block diagram illustrating various aspects of one embodiment of a laser controller.

Referring now to FIG. 5, the relationship of the dither modulation signal introduced to an external cavity with respect to the detected voltage modulation across gain medium 12 is illustrated graphically as wavelength versus relative intensity. FIG. 2 shows a grid etalon pass band PB2, together with frequency or dither modulation signals 104A, 104B, 104C corresponding to external cavity laser modes 106A, 106B and 106C respectively. Frequency modulation signals 104A–C are introduced to the laser external cavity by voltage modulation of electro-optic element 58 in the manner described above. As shown in FIG. 6, laser mode 106A is off-center with respect to the center of pass band PB2 towards the shorter wavelength, side of pass band PB2, while laser mode 106B is located at about the center wavelength of pass band PB2, and laser mode 106C is located on the longer wavelength side of pass band PB2. Laser mode wavelength 106B corresponds to a wavelength lock position and represents an optimal loss profile for the external cavity. Laser modes 106A and 106B are off-center with respect to pass band PB2 and result in non-optimal cavity loss profiles which will require adjustment of the external cavity length l, either by adjusting the effective optical thickness of electro-optic element 58 or by positioning end mirror 14 as described above.

The voltage detected across gain medium 12 by voltage detector 96 for dither signals 104A, 104B add 104C are shown respectively as voltage modulation signals 108A, 108B and 108C on the right side of FIG. 6, which correspond respectively to the laser mode wavelengths 106A, 106B and 106C. The location of laser mode 106A at a wavelength shorter than that of the center wavelength of pass band PB2 results in voltage signal 108A having a modulation that is in phase with the dither modulation signal 104A. The location of laser mode 106C at a greater wavelength than the center wavelength of pass band PB2 results in a modulation of voltage signal 108C that is out of phase with respect to the modulation of dither signal 104C.

The location of each laser mode wavelength with respect to the slope of pass band PB2 affects the amplitude of the corresponding voltage signal. Thus, voltage signal 108A, which corresponds to laser mode 106A wavelength on a relatively steep slope of pass band PB2, has a relatively large modulation amplitude, while voltage signal 108C, which corresponds to laser mode 106C associated with a portion of pass band PB2 having a less steep slope, has a correspondingly smaller modulation amplitude. Voltage signal 108B, which corresponds to centered laser mode 106B, has a minimal modulation amplitude since the period of the dither modulation signal 104B occurs symmetrically about the center wavelength of pass band PB2. The frequency of the dominant intensity in the case of voltage signal 108B in this instance is twice the frequency of dither modulation signal 104B.

From FIG. 5 it can be seen that the amplitude of the modulation detected in the voltage across gain medium 12 indicates the magnitude of correction or adjustment required for the laser external cavity, while the phase of voltage signal modulation indicates the direction of the adjustment. The amplitude of dither modulation signals 104A–C is selected so that, during wavelength lock, the variation in the intensity of voltage signal modulation is held to acceptable levels for the particular use of the external cavity laser. The frequency of the dither modulation is chosen to be high enough to provide coherence control, but low enough to prevent interference with information modulated onto the carrier signal provided by the external cavity laser during transmission.

FIG. 6 is a hardware block diagram illustrating various aspects of one embodiment of a laser controller that may be configured to implement the functionality of the control system as depicted in FIG. 4. Various features of a laser assembly such as the assembly 10 described previously in conjunction with FIG. 1 are also illustrated in FIG. 6. Features that correspond to those of FIG. 1 and FIG. 4 are numbered identically for simplicity and clarity. It is noted that in other embodiments, various features of the laser controller of FIG. 6 as discussed below may be used in conjunction with other configurations of laser assemblies. Furthermore, such controllers and laser assemblies may omit various functionality as discussed above in conjunction with FIGS. 1–5.

The laser controller of FIG. 6 includes a microprocessor (CPU) 602 coupled through an interconnect bus 610 to a read-only memory (ROM) 604, a random access memory (RAM) 606 and a field programmable gate array (FPGA) 608. FPGA 608 is coupled to a stepper motor driver 612, amplifiers 614–616, and a low pass filter 618. FPGA 608 is further shown coupled to a digital-to-analog converter 620, an analog interface unit 622, and an analog-to-digital converter 624. A laser current source 86 is shown coupled to an output of digital-to-analog converter 620.

Power to the components of the laser controller illustrated in FIG. 6 is provided by a power source 630. In one embodiment, power source 630 receives 5 volt input power and generates output power of varying voltage levels to appropriately supply power to the components of controller 600. Power source 630 may be implemented using a high efficiency switching regulator circuit.

Microprocessor 602 and FPGA 608 operate concurrently and in cooperation with each other to perform various functionality as depicted in FIG. 4 and described hereinbelow. It is noted that operations performed by microprocessor 602 may be conducted in accordance with the execution of software code stored within ROM 604. In one embodiment, microprocessor 602 is implemented using a general purpose microprocessor, such as a Motorola MCF5206e microprocessor. It is noted that in other embodiments, a digital signal processor or other specialized hardware may be employed in place of microprocessor 602. It is further noted that in other embodiments, other programmable logic devices, such as a CPLD (Complex Programmable Logic Device) may be employed in the place of FPGA 608. Alternatively, one or more ASICs (Application Specific Integrated Circuits) could be employed. Still additional embodiments are contemplated that combine various functionality of microprocessor 602 and FPGA 608 as described herein within a single device.

Generally speaking, microprocessor 602 and FPGA 608 collectively operate to measure and process various parameters associated with the operation of laser assembly 10 and to perform various control functions. In one particular implementation, microprocessor 602 and FPGA 608 are clocked at 40 MHz.

As illustrated in FIG. 6, laser assembly 10 may include a laser temperature sensor 631 located in proximity to gain medium 12, a grid generator temperature sensor 632 located in proximity to grid etalon 34, a cavity length actuator temperature sensor 633 located in proximity to tuning arm 74, and an ambient temperature sensor 634. Each of the sensors 631–634 may be implemented using a thermistor, although other temperature dependent devices may be employed in other embodiments. Laser assembly 10 may further include one or more photodiodes 15 positioned at selected locations of the laser assembly to receive light associated with the operation of the external cavity laser. In the illustrated embodiment, FPGA 608 may be programmed to periodically detect signals associated with each of sensors 631–634, photodiodes 15, and/or gain medium 12 through analog interface 622 and analog-to-digital converter 624. For this purpose, analog interface 622 includes multiplexers 650–652 and an anti-alias filter 653. Multiplexers 650–652 operate under the control of FPGA 608 to periodically couple a signal associated with a selected one of sensors 631–634, split detector 658, or gain medium 12, for signal detection. These operations will be described in further detail below.

FPGA 608 is additionally configured to generate control signals for controlling various functionality of laser assembly 10. More particularly, in the embodiment of FIG. 6, FPGA 608 is configured to generate a control signal for controlling the position of a channel selector stepper motor 46a through a stepper motor driver 612 (which are collectively representative of the drive element 46 of FIG. 1). As discussed previously, a position indicator 50 coupled to FPGA 608 may further provide an indication of the position of drive element 46 (or to indicate when the drive element is at a home position). The control signal generated by FPGA 608 for controlling the position of stepper motor 46A may be driven in accordance with a control value stored within a storage location of FPGA 608. This storage location may be periodically updated with new values through the execution of instructions executed by microprocessor 602.

FPGA 608 may also be configured to generate a control signal for controlling grid generator temperature controller (TEC) 66, which regulates the temperature of grid etalon 34. FPGA 608 may similarly generate control signals for controlling a cavity length actuator temperature controller 78, which regulates the temperature of tuning arm 74, and a laser 79, which regulates the temperature of gain medium 12. In one embodiment, each of the temperature controllers 66, 78 and 79 are, controlled by pulse-width modulated (PWM) signals generated by FPGA 608. Each of the temperature controllers may be implemented using a peltier device. In one specific implementation, the pulse-width modulated signals are generated at a repetition rate of 200 kHz. Amplifiers 614–616 are provided to amplify the PWM signals generated by FPGA 608. It is noted that in alternative embodiments, other forms of control signals may be generated to control selected functions of laser assembly 10.

FPGA 608 may further be configured to generate a modulation signal for driving modulation element 58. For this purpose, FPGA 608 may be configured to generate a pulse-width modulated signal which is input to a low-pass filter 618 which correspondingly provides an analog modulation signal that is passed to an amplifier 619.

In one particular implementation, the modulation signal provided from the output of low-pass filter 618 is in the form of a sinusoidal wave at 20 kHz. The PWM signal generated by FPGA 608 may have a frequency consistent with that of the other PWM signals generated by FPGA 608. For example, in one embodiment, the PWM signal has a frequency of 200 KHz. Further details regarding generation of a modulation signal for driving modulation element 58 will be provided further below.

The sampling of signals associated with sensors 631–634, photodiodes 15, and/or gain medium 12 may be performed synchronously with the generation of the PWM control signals that drive temperature controllers 66, 78, and 79, as well as the PWM signal provided to low pass filter 618. The precise timing and synchronization of the control signals with the detected signals reduces the potential noise sources to a DC offset by mixing the fundamental component down to 0 or DC. The DC offsets can be subtracted from the signal in interest.

As described previously in conjunction with FIG. 5, the amplitude of the modulation detected in the voltage cross gain medium 12 indicates the magnitude of correction or adjustment required for the laser external cavity, while the phase of voltage signal modulation indicates the direction of the adjustment. Accordingly, in one embodiment the voltage across laser 12 is periodically measured by FPGA 608 through analog interface 622 and analog-to-digital converter 624. The voltage signal may be amplified with a single stage pre-amp within analog interface 622 and then multiplexed through multiplexer 650 into a common anti-alias filter 653. Multiplexer 652 is set to provide the output of anti-alias filter 653 to analog-to-digital converter 624.

In one particular implementation, following a predetermined settling time after FPGA 608 sets multiplexers 650 and 652 in a manner to convey a signal corresponding to the voltage across gain medium 12 to analog-to-digital converter 624, FPGA 608 performs a burst of, for example, 50 separate and consecutive voltage readings associated with the voltage across gain medium 12. Each of the voltage readings (in the form of digital data generated by analog-to-digital converter 624) may be temporarily stored within FPGA 608, and is subsequently transferred into RAM 606. Upon receipt of data from analog-to-digital converter 624 by FPGA 608, FPGA 608 may signal microprocessor 602 which may responsively invoke an internal direct memory access control mechanism to carry out the transfer of the data from FPGA 608 to RAM 606.

Upon storing a set of data indicative of the voltage across gain medium 12 within RAM 606, microprocessor 602 performs a Fourier Transform to transform the temporal data to a frequency domain to separate the DC, fundamental and/or harmonic terms. In one embodiment, microprocessor 602 executes a Fast Fourier Transform (FFT) routine. The FFT routine may be optimized for integer input data as supplied from analog-to-digital converter 624, and may be configured to compute only the output terms of particular interest, such as the fundamental component. As discussed previously, by calculating, for example, the magnitude and phase of the fundamental component, an error signal may be generated to adjust the cavity length. Thus, upon calculation of the error signal, microprocessor 602 writes a value derived from the error signal to a location within FPGA 608 which controls the pulse width of the PWM signal provided to amplifier 616 to drive cavity length actuator temperature controller 78. It is noted that in other embodiments, the error signal may be used to control other mechanisms within a laser assembly to adjust cavity length. It is also noted that in other embodiments, similar measurements may alternatively be taken from one or more photodiodes 15 (or other light detectors) to derive the error signal. In various embodiments and depending upon the signals of interest, multiplexer 650 and/or anti-alias filter 653 of analog interface 622 may be omitted.

Figure 6A:
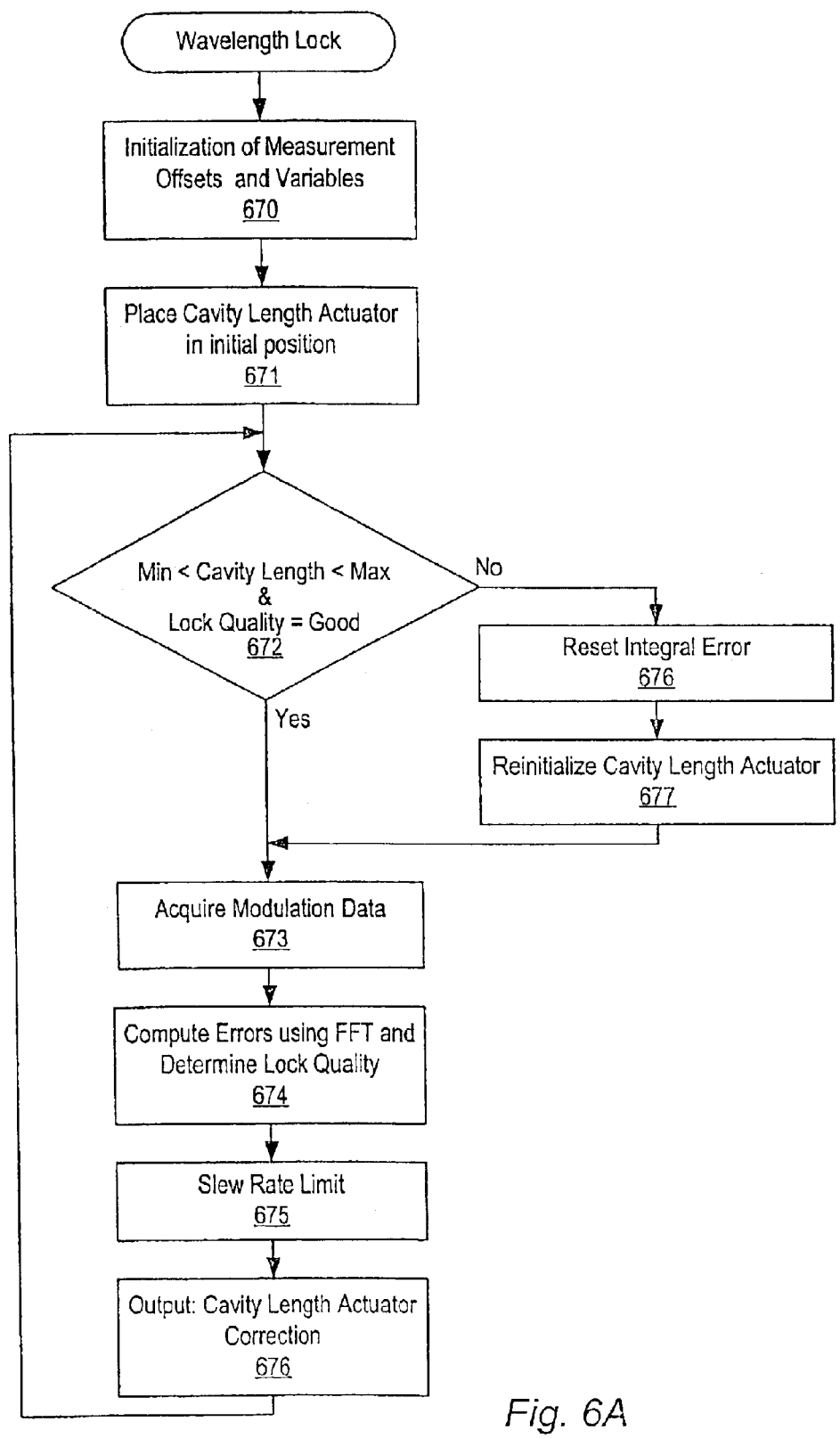
FIG. 6A is a flow diagram illustrating one embodiment of an algorithm for performing wavelength locking.

FIG. 6A illustrates one embodiment of an algorithm for performing wavelength-locking. The wavelength-locking algorithm as depicted in FIG. 6A may be implemented by code executed within microprocessor 602, and in conjunction with the control of FPGA 608 as described herein. When initiated, the algorithm begins by computing offsets, initializing variables, and placing the cavity length actuator 78 in an initial starting position (steps 670 and 671). Next, the algorithm enters a locking loop where the cavity length actuator sensor 633 is measured and the quality of the locking is determined. The quality of locking may be determined by computing a decaying integral of the error signal. If the cavity length actuator sensor indicates a temperature within a predetermined range and if the lock quality is sufficient as determined during step 672, modulation data is acquired during step 673. As discussed previously, the modulation data may be in the form of a set of readings associated with the voltage across gain medium 12, or may be associated with a set of readings taken from one or more photodiodes 15. The fundamental modulation component of the most recent gain medium potential measurement may be used to compute cavity length errors (step 674) and is applied to a compensator in order to minimize the fundamental component. As stated previously, the fundamental modulation component may be computed by an FFT routine executed by microprocessor 602. In other embodiments, other harmonics of the gain medium voltage or photodiode currents may alternatively or additionally be determined and used to compute the error signal. The slew rate associated with the error signal may be limited during step 675. During step 676, microprocessor 602 may write a value in a corresponding storage location of FPGA 608, that controls the generation of the PWM signal to cavity length actuator temperature controller 78 to thereby cause corrections to the cavity length to be made. The locking algorithm repeats these steps unless the cavity length actuator sensor 633 indicates a temperature that is out of a predetermined range or if the lock quality is poor (step 672). An integral error term of the error signal may be reset during step 676, and the cavity length actuator (e.g., tuning arm 74) may be returned to the initial starting position during step 677. The locking loop is subsequently reentered and modulation data is acquired during step 673.

Returning to FIG. 6, laser assembly 10 may further include an EEPROM (electrically, erasable programmable read-only memory) 83 or other non-volatile storage device for storing information particular to laser assembly 10. EEPROM 83 may be embodied upon the same base or within the same housing that includes elements forming the external cavity laser assembly (e.g., including gain medium 12), and separate from, for example, a printed circuit board upon which the hardware associated with controller 600 is mounted. Data may be stored within EEPROM 83 that contains information relevant to wavelength calibration, tuning hints such as temperatures or positions, power or temperature calibration factors, identifying numbers, and operating data. The operating data may contain, for example, information relevant to laser lifetime, such as time-current profiles. By storing this information within EEPROM 83 that may be provided as an integral part of laser assembly 10, interchangeability between laser optic assemblies and controller boards may be possible while retaining device-specific data.

In one particular embodiment, calibration coefficients associated with sensors 631–634 are stored within EEPROM 83. The calibration coefficients may represent deviations from nominal values of sensors 631–634. For example, each of the sensors 631–634 may nominally have the same value of a resistance at ambient temperature. However, due to specific device variations, the actual values associated with sensors 631–634 may deviate from the nominal value. The calibration coefficients may represent the relative differences between the resistances of sensors 631–634 when each is measured at an equal ambient temperature. These calibration coefficients may be stored in EEPROM 83 following manufacture of the laser assembly, and may be used to scale temperature measurements taken from sensors 631–634, as described further below.

The laser controller may further include a network interface such as an Ethernet interface to allow control of the laser functionality by a remotely connected device. In one embodiment, the Ethernet functionality may be used to support an HTTP interface. Additionally, code for controlling operations of microprocessor 602 may be upgraded by downloading through an interface such as, for example, an RS-232 or Ethernet interface. This functionality allows for on-the-fly upgrades. Similarly, the logic configuration of FPGA 608 (or any other programmable logic device) may be modified through an interface such as an RS-232 or Ethernet interface.

Figure 7:
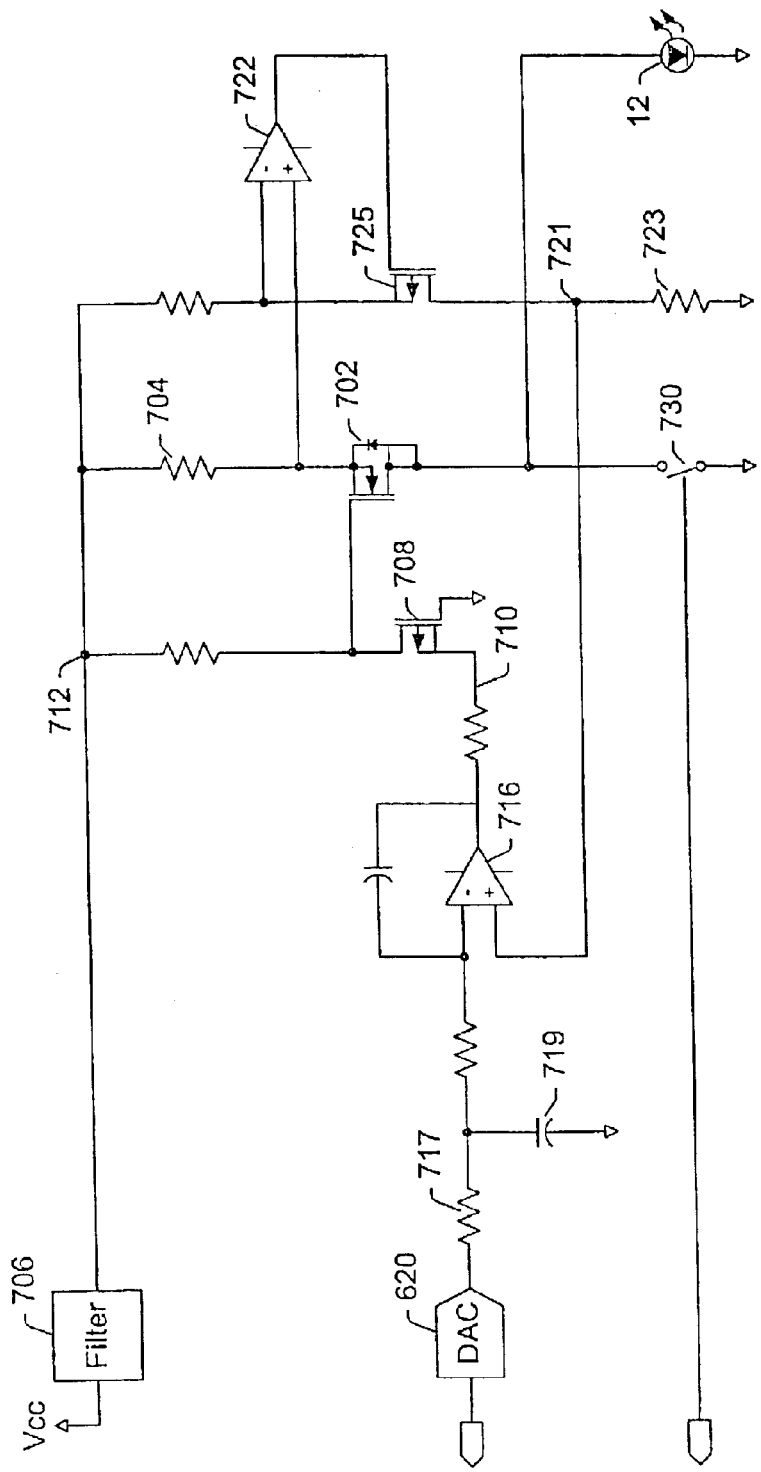
FIG. 7 is a circuit diagram illustrating one embodiment of a laser current source.

FIG. 7 illustrates one embodiment of laser current source 626. The laser current source of FIG. 7 is preferably configured to provide a low noise current to gain medium 12 with reasonable efficiency. As will be described further below, laser current source 626 may also include a mechanism to provide a shutdown of the laser output in the case of a fault condition.

Current flowing through gain medium 12 is passed through a transistor 702 and resistor 704. Transistor 702 may be implemented using a MOSFET (metal oxide semiconductor field effect transistor device). A filter 706, which may be implemented as an LCR filter, is provided to filter high frequency noise at a power supply VCC. Digital-to-analog converter 620 is provided to receive a programmed value from microprocessor 602 which sets the current flowing through gain medium 12.

An operational amplifier 716 regulates the current flowing through transistor 702 by comparing an output of digital analog converter 620, which may be passed through an RC filter formed by resistor 717 and capacitor 719, to a signal at node 721 which is dependent upon current sensed through transistor 702. The RC filter formed by resistor 717 and capacitor 719 may provide residual noises attenuation at mid and upper frequencies. Current flowing through transistor 702 is sensed in accordance with sense resistor 704 and an operational amplifier 722. More particularly, operational amplifier 722 is configured to sense the current flowing through transistor 702 by measuring the voltage across resistor 704. The output of operational amplifier 722 is reflected down to a ground-based voltage using transistor 725, which regulates current flow through a resistor 723 depending upon the voltage across resistor 704. Thus, the voltage at node 721 is a ground referenced voltage indicative of the current flowing through transistor 702. It is noted that the circuit configuration of FIG. 7 allows one of the nodes (e.g., the cathode) of gain medium 12 to be grounded.

The current source of FIG. 7 further includes a transistor 708 connected in a common gate configuration between a node 710 and the gate of transistor 702. In the embodiment shown, transistor 708 is implemented using a FET (field effect transistor). In other embodiments, transistor 708 may be implemented using a bi-polar transistor coupled in a common base configuration. Due to the high output impedance looking into the drain of transistor 708, lower frequency noise on the power supply at node 712 is reflected onto the gate of transistor 702 thus causing $V_{GS}$ to remain constant. Transistor 708 provides level translation up to the gate of transistor 702 without introducing a significant power supply voltage dependence. Thus, while the current flowing through transistor 702 will be dependent upon the voltage at node 710 which is controlled by the output of operational amplifier 716, the output current of transistor, 702 is largely unaffected by low frequency noise on the power supply at node 712. Operational amplifier 716 maintains the DC current at the programmed level.

Switch 730, which may be implemented using a transistor such as a FET or bi-polar transistor, provides the user with a fast acting laser shutdown. Preferably, switch 730 may have a low voltage threshold so even in a worst-case, a relatively low voltage may, be sufficient to drive the transistor into conduction and divert the current source from the gain medium 42. It is noted that control of the switch 730 may be conducted independent, of the operation of microprocessor 602 (FIG. 5). Thus, the laser may be shut down even if malfunctions associated with the execution of instructions by microprocessor 602 occur.

It is noted that in other embodiments, other particular current source circuits may, be employed for providing current to gain medium 12. Such alternative circuit configurations may employ a drive transistor for supplying current to a laser device, a control circuit for controlling the level of current supplied to the laser device, and a common gate transistor (or common base transistor) coupled between the control circuit and a control terminal of the drive transistor to reduce the effects of noise. Such circuits may additionally employ a switch for diverting current from the laser device.

Figure 8:
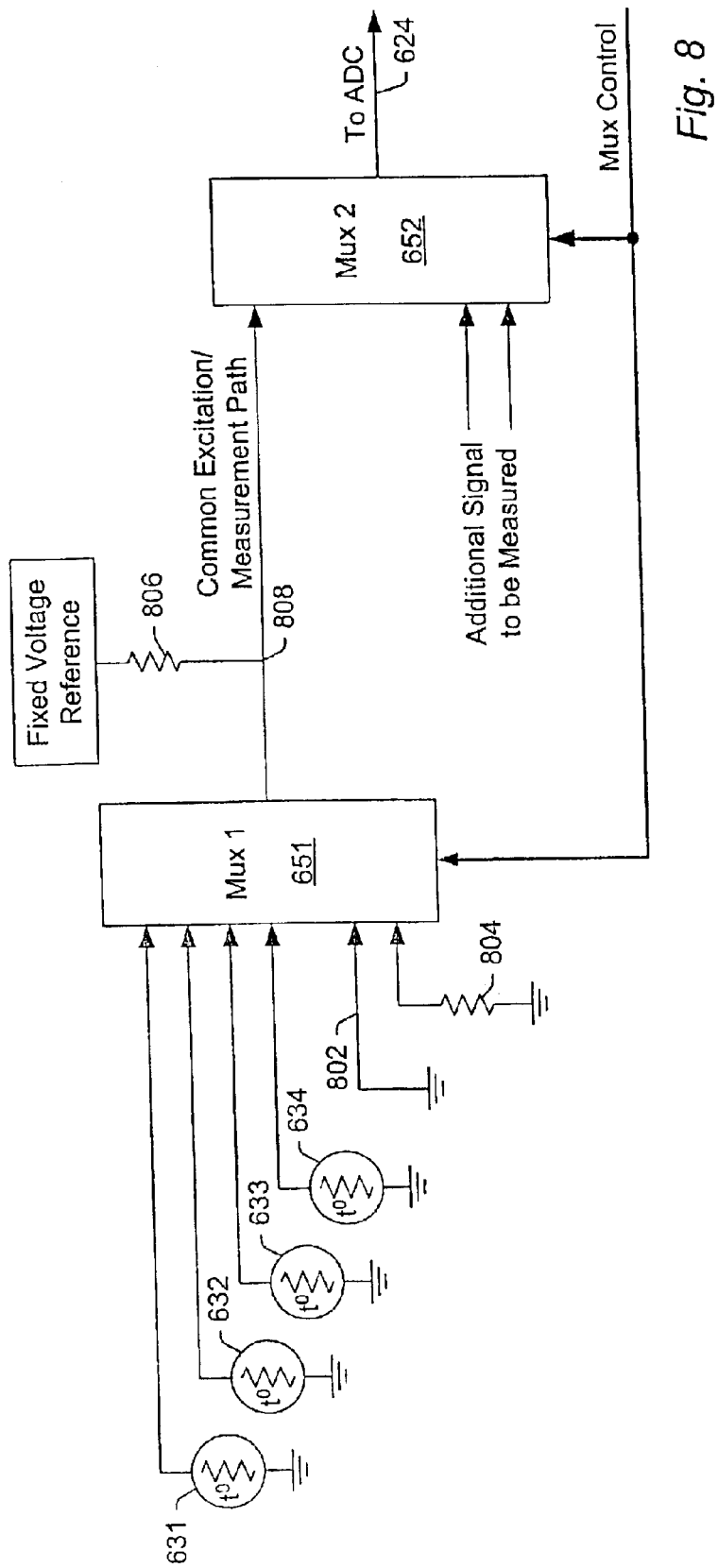
FIG. 8 is a circuit diagram illustrating one embodiment of an analog interface.
Figure 9:
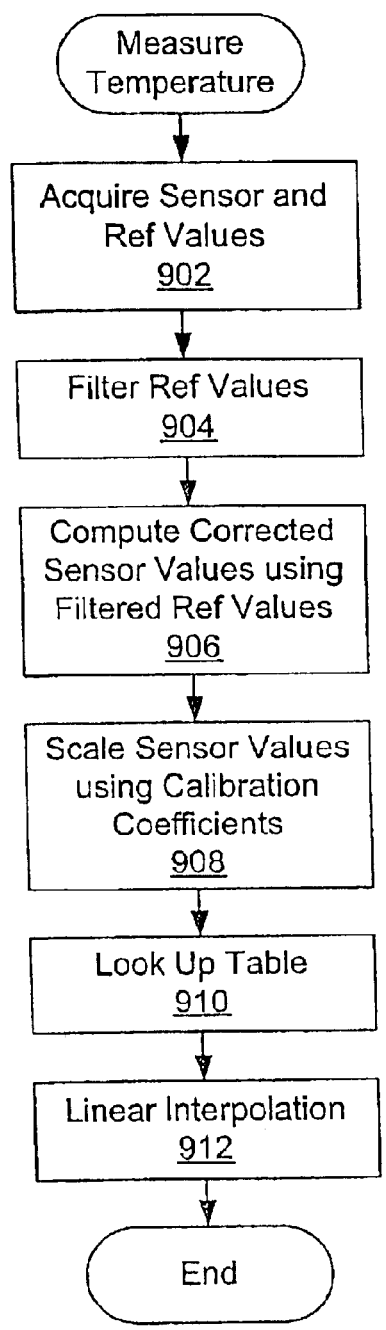
FIG. 9 is flow diagram illustrating a method for performing temperature measurements.

FIG. 8 illustrates one embodiment of analog interface 622 for the measurement of temperatures within laser assembly 10. Circuit portions that correspond to those of FIG. 6 are numbered identically. FIG. 9 is a flow diagram depicting a method for temperature measurements.

Referring collectively to FIGS. 6, 8 and 9, FPGA 608 sets multiplexers 651 and 652 in modes to selectively convey a signal generated by one of the temperature sensors 631–634 or other input to analog-to-digital converter 624 for data capture within FPGA 608. Additional multiplexer 651 inputs include a ground reference 802 and a precision reference 804. Precision reference input 804 may be implemented using a precision resistor. Depending upon the mode of multiplexer 651 as controlled by FPGA 608, one input at a time is coupled to the output of multiplexer 651, which in turn is coupled to a fixed voltage reference through a fixed resistance 806. Thus, one of the temperature sensors 631–634 or precision reference 804 may be connected to form the lower leg of voltage divider. For example, when FPGA 608 sets multiplexer 651 in a mode that connects temperature sensor 631 to the output of multiplexer 651, current flows from the fixed voltage reference through resistor 806 and temperature sensor 631, and the voltage at node 808 is measured. The voltage at node 808 is conveyed through a common measurement path through multiplexer 652 to analog-to-digital converter 624, where the voltage is converted to a digital value which may be sampled by FPGA 608, as discussed previously. FPGA 608 may set multiplexer 651 and 652 to select a particular one of sensors 631–634, ground reference 802, or precision reference 804 to take a corresponding measurement.

Measurements associated with ground reference 802 and precision reference 804 are performed to allow for the correction of DC offsets and gain associated with the temperature measurement circuitry. As illustrated in FIG. 9, in one embodiment, after FPGA 608 has acquired voltage readings associated with all inputs of multiplexer 651 during step 902, microprocessor 602 may execute code stored in memory (within RAM 606, for example) to filter the reference value associated with ground reference 802 and/or precision reference 804 (step 904) to compute corrected sensor values (step 906). Subsequently, microprocessor 602 may execute code to scale the sensor values using calibration coefficients stored within EEPROM 83 (step 908).

A lookup table may further be provided within memory (e.g., RAM 606) which correlates various corrected voltage readings with temperature. Thus, during step 910, microprocessor 602 may access entries within the lookup table to determine a corresponding temperature associated with each of the temperature sensor measurements. In one implementation, microprocessor 602 may perform linear interpolation to increase the resolution of the lookup table result.

Figure 10:
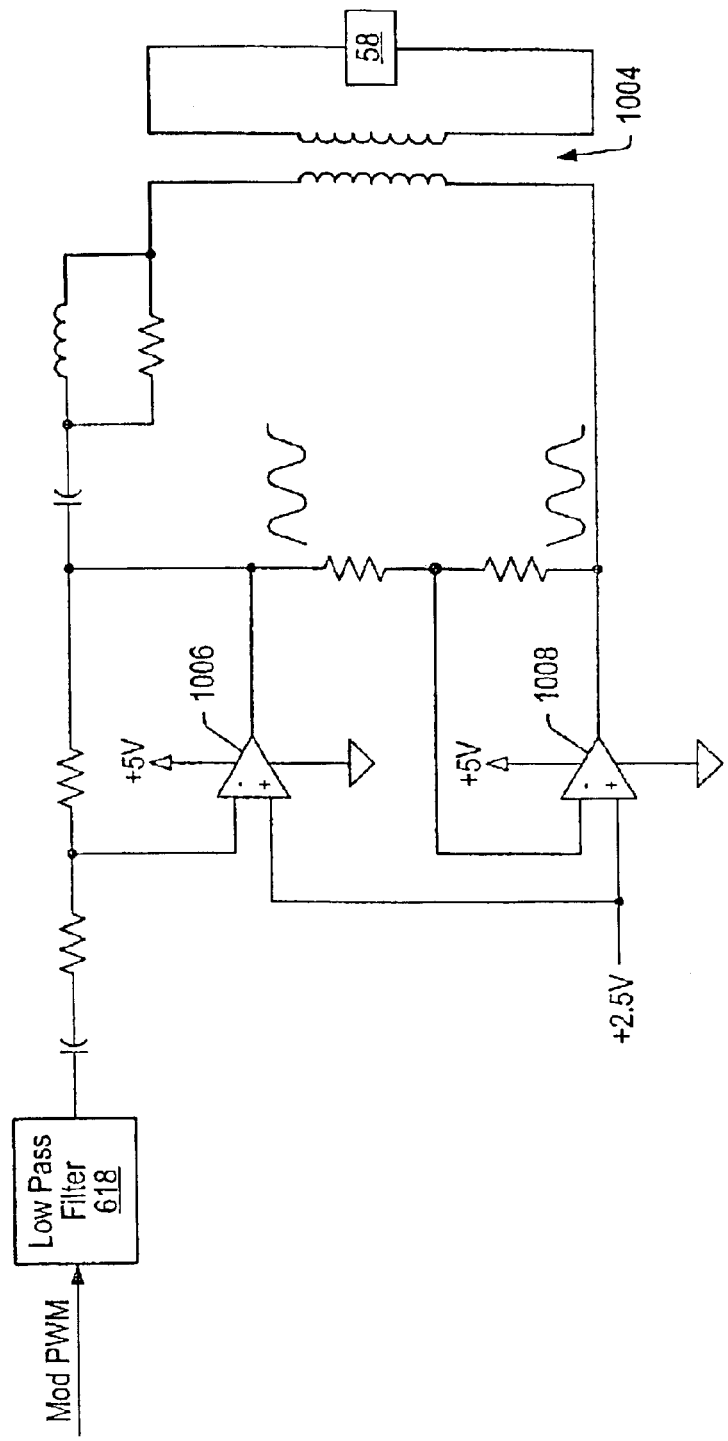
FIG. 10 is a circuit diagram illustrating one embodiment of an amplifier circuit for generating a modulation signal.

Turning finally to FIG. 10, a circuit diagram illustrating one embodiment of an amplifier circuit 619 for generating a modulation signal to drive electro-optic modulation, element 58 is shown. Circuit portions that correspond to those of FIG. 6 are numbered identically for simplicity and clarity.

Referring collectively to FIGS. 6 and 10, FPGA 608 may be programmed to generate a pulse-width modulated signal at line 617 which is provided to low-pass filter 618. In one particular implementation, the pulse-width modulated signal is modulated according to variations which approximate a sinusoidal wave at 20 kHz. The pulse-width modulated signal may be generated according to a set of stored values within FPGA 608, that are provided by microprocessor 602. In one particular implementation, a set of 10 values are stored within FPGA 608 to control the particular modulation associated with the pulse-width modulated signal at line 617.

Low-pass filter 618 filters the pulse-width modulated signal at line 617. Thus, a sinusoidal wave form at 20 kHz may be output from low-pass filter 618. As illustrated in FIG. 10, amplifier circuit 619 includes a transformer 1004 having a primary connected in a push-pull configuration (also known as a bridge-tied load). The amplified modulation signal is inverted by a first operational amplifier 1006 and again by another operational amplifier 1008. Thus, the output of operation amplifier 1008 takes the form of a sinusoidal wave that is 180 degrees out of phase with respect to a similar sinusoidal signal at the output of operational amplifier 1006.

It is noted that in other embodiments, other signal conversion circuits such as other types of analog filters may be employed in the place of low-pass filter 618 for converting the digital output of FPGA 608. It is further noted that in other embodiments, other forms of amplifier circuits may be coupled in a push-pull configuration to the primary of transformer 1004. For example, in one embodiment, a class D amplifier may be employed in the place of low-pass filter 618 and the amplifier circuitry including operation amplifiers 1006 and 1008. The output of the class D amplifier may be coupled to drive the primary of transformer 1004 through an LC filter, and may be coupled in a push-pull configuration.

As a result of the push-pull configuration, a voltage of approximately $2V_{CC}$ peak-to-peak variations (twice the supply voltage) may be generated across the primary of transformer 1004. Return current through the primary of transformer 1004 is passed through operational amplifier 1008, rather than running return current through ground. Noise due to the generation of the 20 kHz modulation signal on the ground reference may thereby be reduced. In one embodiment, transformer, 1004 has a coil ratio of 120 to 1, thereby generating a voltage of up to 1000 volts peak to peak at the output of the secondary of the transformer 1004 to drive the modulation element 58.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A control circuit for generating a modulating output signal for driving an optical path length modulator in a tunable laser comprising:
   waveform generation circuitry for generating an analog signal;
   an amplifier circuit to receive the analog signal and configured to produce an amplified analog signal; and
   a transformer including a primary coil coupled to the amplifier circuit in a push-pull configuration and a secondary coil for providing the modulating output signal.

2. The control circuit as recited in claim 1 wherein the waveform generation circuitry includes a programmable logic device for generating a digital output signal.

3. The control circuit as recited in claim 2 wherein a signal conversion circuit converts said digital signal to said analog signal.

4. The control circuit as recited in claim 3 wherein the signal conversion circuit comprises a low-pass filter.

5. The control circuit as recited in claim 4 wherein said digital signal is a pulse width modulated signal.

6. The control circuit as recited in claim 1 wherein said amplifier circuit includes a pair of operational amplifiers having outputs coupled to source and sink current flowing through said primary coil of said transformer.

7. A laser system comprising:
   a tunable laser including an optical path length modulator; and
   a control circuit for generating a modulating output signal for driving the optical path length modulator, the control circuit including:
   waveform generation circuitry for generating an analog signal;
   an amplifier circuit to receive the analog signal and configured to produce an amplified analog signal; and
   a transformer including a primary coil coupled to the amplifier circuit in a push-pull configuration and a secondary coil for providing the modulating output signal.

8. The laser system as recited in claim 7 wherein the waveform generation circuitry includes a programmable logic device for generating a digital output signal.

9. The laser system as recited in claim 8 wherein a signal conversion circuit converts said digital signal to said analog signal.

10. The laser system as recited in claim 9 wherein the signal conversion circuit comprises a low-pass filter.

11. The laser system as recited in claim 10 wherein said digital signal is a pulse width modulated signal.

12. The laser system as recited in claim 6 wherein said amplifier circuit includes a pair of operational amplifiers having outputs coupled to source and sink current flowing through said primary coil of said transformer.

13. The control circuit as recited in claim 1 wherein the path length modulator comprises an electro-optic material.

14. The control circuit as recited in claim 13 wherein the electro-optic material is lithium niobate.

15. The control circuit as recited in claim 1 wherein a frequency of said analog signal is high enough to provide coherence control of said tunable laser but also low enough to prevent interference with information modulated on a carrier signal generated by said tunable laser.

16. The control circuit as recited in claim 4 wherein said low-pass filter and said amplifier circuit comprise a class D amplifier coupled to drive said primary coil.

17. The laser system of claim 7, further comprising a network interface coupled to said laser system and to provide remote operation of said laser system through said network interface.

* * * * *

UNITED STATES PATENT AND TRADEMARK OFFICE
CERTIFICATE OF CORRECTION

PATENT NO. : 6,829,259 B2
DATED : December 7, 2004
INVENTOR(S) : Pontis et al.

It is certified that error appears in the above-identified patent and that said Letters Patent is hereby corrected as shown below:

Column 4,
Line 19, delete "when" and insert -- Wedge --.

Column 5,
Line 41, delete "a" and insert -- an --.

Column 6,
Line 7, delete "etaloh" and insert -- etalon --.

Column 8,
Line 40, delete "thee" and insert -- the --.

Column 9,
Line 15, delete "add" and insert -- and --.

Column 14,
Line 23, delete "noises" and insert -- noise --.
Line 61, delete "42" and insert -- 12 --.

Signed and Sealed this

Eleventh Day of October , 2005

JON W. DUDAS
*Director of the United States Patent and Trademark Office*